United States Patent [19]

Anthony et al.

[11] 4,198,247
[45] Apr. 15, 1980

[54] SEALANT FILMS FOR MATERIALS HAVING HIGH INTRINSIC VAPOR PRESSURE

[75] Inventors: Thomas R. Anthony, Schenectady, N.Y.; Harvey E. Cline, Stanford, Calif.; Douglas E. Houston, Ballston Lake, N.Y.

[73] Assignee: General Electric Company, Schenectady, N.Y.

[21] Appl. No.: 967,281

[22] Filed: Dec. 7, 1978

[51] Int. Cl.$^2$ ............................................. H01L 21/228
[52] U.S. Cl. ..................................... 148/1.5; 148/187; 148/188
[58] Field of Search ....................... 148/1.5, 187, 188; 252/62.3 E, 62.3 GA

[56] References Cited

U.S. PATENT DOCUMENTS

| 2,813,048 | 11/1957 | Pfann | 75/65 ZM |
| 3,972,741 | 8/1976 | Anthony et al. | 148/1.5 |
| 3,988,766 | 10/1976 | Anthony et al. | 148/1.5 X |
| 4,141,757 | 2/1979 | Cline et al. | 148/188 X |
| 4,159,215 | 6/1979 | Chang et al. | 148/188 X |
| 4,159,216 | 6/1979 | Anthony et al. | 148/1.5 |

Primary Examiner—G. Ozaki
Attorney, Agent, or Firm—Donald M. Winegar; James C. Davis, Jr.; Leo I. MaLossi

[57] ABSTRACT

A sealant film is employed to migrate species having a high intrinsic vapor pressure through a solid body of semiconductor material by temperature gradient zone melting.

10 Claims, No Drawings

SEALANT FILMS FOR MATERIALS HAVING HIGH INTRINSIC VAPOR PRESSURE

FIELD OF THE INVENTION

This invention relates to the manufacture of semiconductor devices by employment of thermal gradient zone melting and, more specifically, to a method of utilizing a migrating species having a high intrinsic vapor pressure.

DESCRIPTION OF PRIOR ART

W. G. Pfann describes in his book, "Zone Melting," John Wiley and Sons, Inc. (1958), a thermal gradient zone melting (TGZM) process to produce P-N junctions within the bulk of a semiconductor material. In his method either sheets, wires or droplets of a suitable metal are pressed against a semiconductor crystal subjected to a thermal gradient. Upon melting and alloying with the semiconductor body, these metalrich zones penetrate into and move through the semiconductor crystal. Doped liquid-epitaxial material is left behind the migrating liquid zone. For two decades, this process of temperature gradient zone melting has been practiced in an attempt to make a variety of semiconductor devices.

More recently the temperature gradient zone melting process has been commercialized. In a series of patents, "Multiple P-N Junction Formation With an Alloy Droplet," U.S. Pat. No. 3,972,741; "Method of Making Deep Diode Devices," U.S. Pat. No. 3,901,736; "High Velocity Thermal Migration Method of Making Deep Diodes," Ser. No. 411,021 now U.S. Pat. No. 3,910,801; "Deep Diode Devices and Method and Apparatus," Ser. No. 411,001, now abandoned in favor of Ser. No. 552,154, now U.S. Pat. 4,075,038; "High Velocity Thermomigration Method of Making Deep Diodes," U.S. Pat. No. 3,898,106; "Deep Diode Device and Method," U.S. Pat. No. 3,902,925; and "Stabilized Droplet Method of Making Deep Diodes Having Uniform Electrical Properties," U.S. Pat. No. 3,899,361; and "Thermomigration of Metal-Rich Liquid Wires Through Semiconductor Materials," U.S. Pat. No. 3,899,362, improvements are described which make TGZM commercially feasible.

In all of Pfann's work and the above patents, only metal-rich zones with low vapor pressures were used. This restriction to low vapor pressure zones was necessary because penetration of the liquid zone into the solid semiconductor body typically required 100-400 seconds before the metal zone was completely encapsulated within the semiconductor body. If the vapor pressure of the zone was high, the zone would evaporate at the high temperatures required for temperature gradient zone melting before penetration and encapsulation of the zone occurred. Such evaporation therefore made temperature gradient zone melting of volatile species impossible.

This restriction of temperature gradient zone melting to relatively non-volatile species is a very severe one in view of the fact that all N-type dopants of the most commonly used semiconductor; namely, silicon, are very volatile. These N-type dopants include arsenic, antimony and phosphorus. Consequently, all commercial temperature gradient zone melting has been restricted to P-type metal-rich zones doping N-type silicon.

In our copending application, "Droplet Migration Doping Using Carrier Droplets", Ser. No. 944,280 one means of circumventing the high vapor pressure problem of the N-type dopants is to use inert carrier droplets, such as gold, that contain only a small percentage of the N-type dopant in solution. By Raoults law, the vapor pressure $P_N^C$ of the N-type dopant is reduced in a solution of an inert carrier from its value $P_N^o$ over its pure form. This reduction is given by Raoults law $$(P_N^c/P_N^o) = X_N$$

when $X_N$ is the atom fraction of the N-type dopant in the inert carrier. For example, a 1 atomic % concentration of antimony in gold will have a vapor pressure of antimony of 1/100 that of pure antimony.

It has been found that this reduction of vapor pressure by solution and dilution is sufficient to allow a zone to penetrate and encapsulate in a semiconductor body without losing all of the N-type dopant. In this manner, N-type doping has been accomplished by temperature gradient zone melting.

In a number of cases, the use of an inert carrier droplet to N-dope a semiconductor crystal by temperature gradient zone melting is not desirable. For example, the use of gold as an inert carrier droplet causes the lifetime of minority carriers in the redeposited epitaxial material behind the zone to be very low. For applications such as solar cells, such low lifetime regions are undesirable. Another disadvantage of the inert carrier technique is that the resulting N-dopant concentration in the epitaxial material deposited behind the moving zone is only a small fraction of what it would be if a pure N-type liquid zone could be used. For devices such as the "Semiconductor Neuron" described in our copending application, Ser. No. 946,609, now Pat. No. 4,163,983 very high N-type concentrations are required and these are most easily achieved by using pure N-type liquid zones.

Consequently, it is desirable to be able to use pure N-type liquid zones to form regions of N-type conductivity in a body of semiconductor material by temperature gradient zone melting.

Thus, an object of this invention is to provide a new and improved process of making N-type regions in a body of semiconductor material which overcomes the deficiencies of the prior art.

Another object of this invention is to provide a new and improved process of making N-type regions in a body of semiconductor material with the maximum solubility of the N-type dopant.

Another object of this invention is to provide a new and improved process for using volatile species for the liquid zone in temperature gradient zone melting.

Other objects will, in part, be obvious and will, in part, appear hereinafter.

BRIEF DESCRIPTION OF THE INVENTION

In accordance with the teachings of this invention there is provided a new and improved method for migrating a melt of metal-rich semiconductor material through a solid body of semiconductor material. The improvement consists of using a composite material for forming the migrating melt. The first material of the melt consists of an N-type dopant impurity metal selected from the group consisting of antimony, arsenic, and phosphorus. The second material comprises a material which is not volatile, or appreciably soluble in the first material, and has a melting point temperature greater than, the temperature at which temperature gradient zone melting is practiced.

The second material may be tungsten, molybdenum, tantalum, silicon nitride, a refractory oxide or a refractory compound.

DESCRIPTION OF THE INVENTION

A body of semiconductor material has a selected resistivity, a first type conductivity and two opposed major surfaces which are the top and bottom surfaces respectively thereof. The semiconductor material comprising the body may be silicon, germanium, silicon carbide, gallium arsenide, a semiconductor compound of a group II element and a Group VI element and a semiconductor compound of a Group III element and a Group V element. In order to describe the invention more fully, the body is said to be of silicon semiconductor material having a P-type resistivity.

The body of silion is mechanically polished, chemically etched to remove any damaged surfaces, rinsed in deionized water and dried in air.

The processed body is disposed in a metal evaporation chamber. A first layer of a first material is deposited on the top surface of the body. The material of the first layer is an element that can impart an N-type conductivity to the material of the body. This first layer of material may be antimony, arsenic or phosphorus. The thickness of the layer is from about ½ to about 25 microns.

The preferred method of depositing the first material layer onto the surface of the silicon body is by the electron beam method. It has been discovered that the vapor deposition of layer of material should be performed at a pressure of less than $5 \times 10^{-5}$ torr. When the pressure is greater than $5 \times 10^{-5}$ torr, we have found that the material layer will not reliably penetrate into the silicon and migrate through the body. It is believed that the layer of material is saturated with oxygen which prevents the reduction of a thin layer of silicon oxide formed when the silicon surface is exposed to air by the material, and thus prevents a good wetting of the contiguous surface of the silicon.

Employing well-known photolithographical techniques, a photoresist, such for example as Kodak Metal Etch Resist, is disposed on the surface of the material layer. The resist is dried by baking at a temperature of about 80° C. A suitable mask of a droplet, line or a grid of a predetermined width and geometry is disposed on the layer of photoresist and exposed to ultraviolet light. After exposure the layer of photoresist is washed in xylene to open windows in the photoresist layer where the material layer is desired to be selectively etched away.

Selective etching of the layer is accomplished with a buffered nitric acid solution. The etching is continued until a second series of windows are opened in the layer corresponding to the windows in the photoresist layer.

The processed body is rinsed in deionized water and dried. The remainder of the photoresist mask is removed by immersion in concentrated sulphuric acid at 180° C. or immersion in a mixture of one part by volume of hydrogen peroxide and one part by volume of sulphuric acid.

The processed body is rinsed in deionized water and blown dry. Preferably, a gas such, for example, as freon, argon and the like is suitable for drying the processed body.

The processed body is disposed in a metal evaporation chamber. A second layer of material is deposited on the surface of body including the remaining areas of the first material layer. The material of the second layer comprises an element or compound that is not either volatile or appreciably soluble in the first material and has a melting point temperature which is greater than the temperature at which temperature-gradient-zone-melting is practiced. Additionally, the material of the second layer should not form an alloy melt with a portion of the semiconductor material of body that it is in contact therewith. The thickness of the deposited second material is from about 1 to about 10 microns. Suitable materials for the second layer are, for example, tungsten, molybdenum, tantalum, silicon nitride, refractory oxides and refractory compounds.

The preferred methods of depositing the material of the second layer onto the first material layer and onto the body are by sputtering and electron beam deposition. Deposition should be carried out by means familiar to those skilled in the art to form a layer that is impervious to the vapor of the material of the first layer.

The second layer may be alternatively formed by reacting a gas with the material of the first layer to form an overlayer of sealant material on the first layer. For example, if the material of the first layer is aluminum, the first layer is exposed to gaseous oxygen to form an aluminum oxide layer over the aluminum layer. As a second example, if the material of the first layer were antimony, the body with the deposited layer of antimony would be reacted with an overlayer of magnesium to form a layer of the intermetallic compound magnesium antimonide, $Mg_3Sb_2$. The excess magnesium following a short reaction period would be removed by a preferential etch.

The function of the layer of second material, which is impervious to the vapor of the material of the first layer is to allow sufficient time for the material of the first layer to penetrate into and encapsulate itself within a melt zone in the body before the material of the first layer evaporates because of its high inherent volatility at the processing temperature.

The second layer of material will prevent the evaporation of the material of the second layer if the vapor pressure of the first layer material is less than the ambient pressure at which temperature gradient zone melting is practiced. Since temperature gradient zone melting is ordinarily carried out at atmoshpheric pressure, the second layer of material will allow temperature gradient zone melting to be practiced up to the temperature at which the partial pressure of the material of the first layer exceeds one atmosphere. Table I gives the temperatures at which the vapor pressures of the common N-type dopant materials, P-type dopant materials and inert carrier element materials exceed one torr. Below these temperatures an impervious second layer of material will prevent evaporation. Above the temperatures of Table II, the impervious second layer of material will tend to be lifted off of the surface of body when the partial pressure of the material of the first layer exceeds one atmosphere thereby allowing evaporation of the first layer to occur.

TABLE I

| Element | Temperature At Which Partial Pressure Greater Than 1 Torr |
| --- | --- |
| Antimony | 1030° K. |

TABLE I-continued

| Element | Temperature At Which Partial Pressure Greater Than 1 Torr |
|---|---|
| Phosphorus | 534° K. |
| Arsenic | 645° K. |
| Silver | 1605° K. |
| Aluminum | 1830° K. |
| Gold | 2040° K. |
| Bismuth | 1170° K. |
| Gallium | 1745° K. |
| Indium | 1520° K. |
| Magnesium | 878° K. |
| Lead | 1250° K. |
| Tin | 1885° K. |
| Thallium | 1100° K. |
| Zinc | 760° K. |

In order to determine when a second layer of material is required as an overlayer to prevent evaporation of the material of the first layer during subsequent temperature gradient zone melting processing, we will allow only a thickness of ¼ of a micron of the material of the first layer to evaporate during an estimated penetration time of 200 seconds. These conditions stipulate that the vapor pressure P in torr of the material of the first layer must be less than $$P = 4 \times 10^{-6} \zeta (T/M)^{\frac{1}{2}} \text{ (Torr)}$$

where $\zeta$ is the density of the material of the first layer, M is the molar weight of the material of the first layer and T is the temperature in degrees Kelvin.

In Table II, the processing temperatures above which an overlayer, or a second layer of material, is required to prevent evaporation of the material of the first layer during the penetration stage of temperature gradient zone melting are listed.

TABLE II

| Element | Processing Temperature Above Which An Overlay Layer is Required To Prevent Evaporation During Penetration |
|---|---|
| Antimony | 690° K. |
| Silver | 1095° K. |
| Aluminum | 1245° K. |
| Gold | 1405° K. |
| Gallium | 1170° K. |
| Tin | 1260° K. |
| Indium | 1005° K. |
| Zinc | 520° K. |
| Lead | 810° K. |
| Bismuth | 780° K. |

The processed body is placed in a thermal migration apparatus, not shown, and the metal droplet, line or grid formed from an alloy melt of the material of the first layer and the semiconductor material of body is migrated through the body by thermal gradient zone melting processing. A unidirectional thermal gradient of approximately 50° C. per centimeter between the bottom surface which is the hot face, and the top surface, which is the cold face, has been discovered to be appropriate for an average temperature of the body of from 700° C. to 1350° C. The process is practiced for a sufficient amount of time to migrate the molten zone through the solid body.

We claim as our invention:

1. A process for making a semiconductor device comprising the steps of:

selecting a body of semiconductor material having a predetermined level of resistivity, a predetermined type conductivity and two major opposed surfaces which are, respectively, the top and bottom surfaces thereof with at least one of the major surfaces having a preferred planar crystal structure orientation and a vertical axis which is substantially parallel with a first axis of the crystal structure and substantially perpendicular to the at least one major surface having the preferred crystal planar orientation;

depositing a predetermined thickness of a layer of a first material of a volatile nature in the liquid state on a predetermined portion of the at least one major surface of the body having the preferred crystal planar orientation with the layer of the first material having a predetermined geometrical configuration;

depositing a predetermined thickness of a layer of a second material of a solid and nonvolatile and insoluble nature at the temperature-gradient-zone-melting temperature over the layer of the first material;

heating the body and the first and second materials deposited thereon to an elevated temperature sufficient to form a melt of only the layer of deposited first material and a portion of the semiconductor body in contact therewith;

establishing a unidirectional temperature gradient across the body between the two opposed major surfaces substantially parallel with the vertical axis wherein the surface upon which the melt is formed is at the lower temperature;

migrating the melt comprising the layer of first material and a portion of the semiconductor material in contact therewith through the entire semiconductor body along the unidirectional thermal gradient from the surface of lower temperature to form a region of recrystallized semiconductor material of the body having solid solubility of the deposited first material therein.

2. The method of claim 1 wherein the first material is one selected from the group consisting of antimony, arsenic and phosphorus.

3. The method of claim 1 or 2 wherein the second material is one selected from the group consisting of tungsten, tantalum and molybdenum.

4. The method of claim 1 or 2 wherein the second material is a refractory oxide.

5. The method of claim 1 or 2 wherein the second material is a refractory compound.

6. The method of claims 1 or 2 wherein the semiconductor material is silicon.

7. The method of claim 2 wherein the first material is antimony, the second material is magnesium, and further including the process steps of reacting the magnesium with a portion of the antimony prior to initiation of the forming of the melt to form a layer of magnesium antimonide to seal the balance of the antimony therein for migration through the body.

8. The method of claim 3 wherein the semiconductor material is silicon.

9. The method of claim 4 wherein the semiconductor material is silicon.

10. The method of claim 5 wherein the semiconductor material is silicon.

* * * * *